US006069529A

United States Patent [19]

Evans

[11] Patent Number: 6,069,529

[45] Date of Patent: May 30, 2000

[54] COMPACT REDUNDANCY COMBINER ASSEMBLY AND METHOD OF OPERATION THEREOF

[75] Inventor: Gwyn Evans, Kings Langley, United Kingdom

[73] Assignee: Com Dev Ltd., Cambridge, Canada

[21] Appl. No.: 09/152,196

[22] Filed: Sep. 14, 1998

Related U.S. Application Data

[60] Provisional application No. 60/058,862, Sep. 12, 1997, and provisional application No. 60/058,885, Sep. 15, 1997.

[51] Int. Cl.[7] ........................ H03F 3/68

[52] U.S. Cl. ........................ 330/124 D; 330/124 R; 333/101; 333/111; 333/113

[58] Field of Search ........................ 330/295, 124 R, 330/124 D, 53, 94, 286; 333/101, 105, 106, 107, 108, 109, 111, 113, 115

[56] References Cited

U.S. PATENT DOCUMENTS

| | | | |
|---|---|---|---|
| 4,010,426 | 3/1977 | Rambo | 330/53 |
| 4,016,503 | 4/1977 | Rambo | 330/124 D |
| 4,565,972 | 1/1986 | Kaegebein | 330/124 D |
| 4,701,716 | 10/1987 | Poole | 330/43 |
| 5,101,171 | 3/1992 | Redmond | 330/124 R |

*Primary Examiner*—Benny Lee
*Assistant Examiner*—Henry Choe
*Attorney, Agent, or Firm*—Darryl W. Schnurr

[57] ABSTRACT

A redundancy combiner assembly has two amplifiers connected in parallel along a waveguide path to a hybrid. The hybrid is connected through a transfer switch to an antenna. The hybrid contains a movable coupling plate. The coupling plate has a coupling array to allow combining of signals of the amplifiers in one position. When one of the amplifiers fails, the coupling plate is replaced by a metal wall and the output from the failed amplifier is directed by the switch to a dump load while the output from the operating amplifier is directed to the antenna. The assembly is controlled by a controller, which monitors the amplifiers and controls the movement of the coupling plate and the switch.

14 Claims, 10 Drawing Sheets

Schematic of CRCA in combining mode

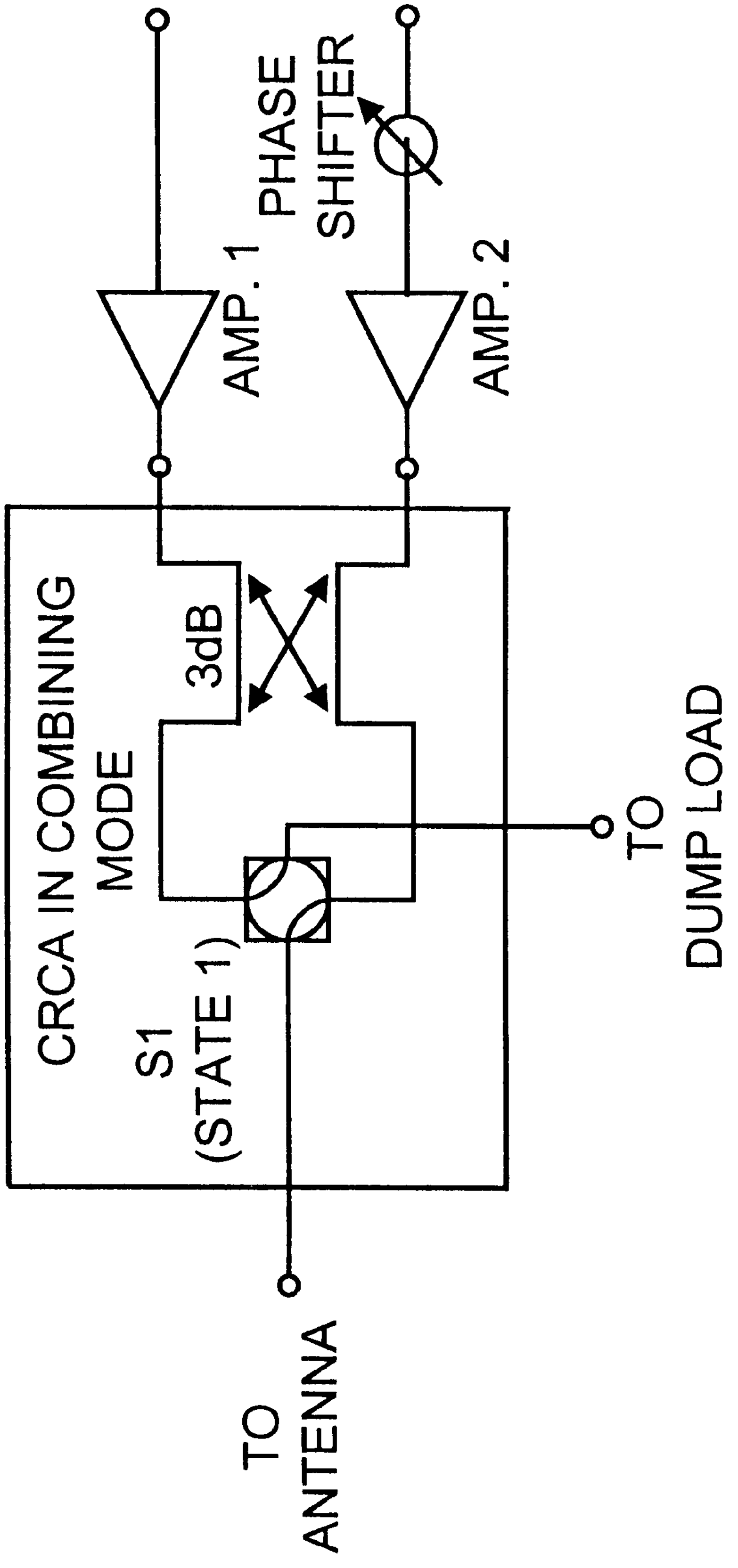
FIGURE 1 - Schematic of CRCA in combining mode

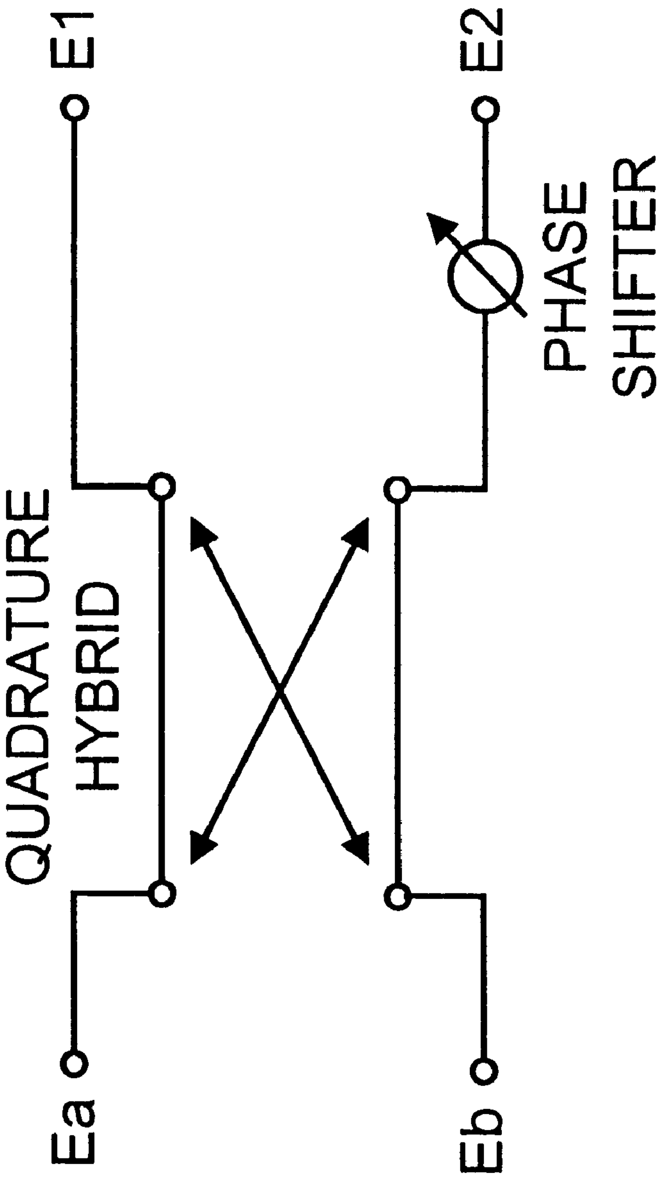
FIGURE 1A - Schemayic of a phase combiner

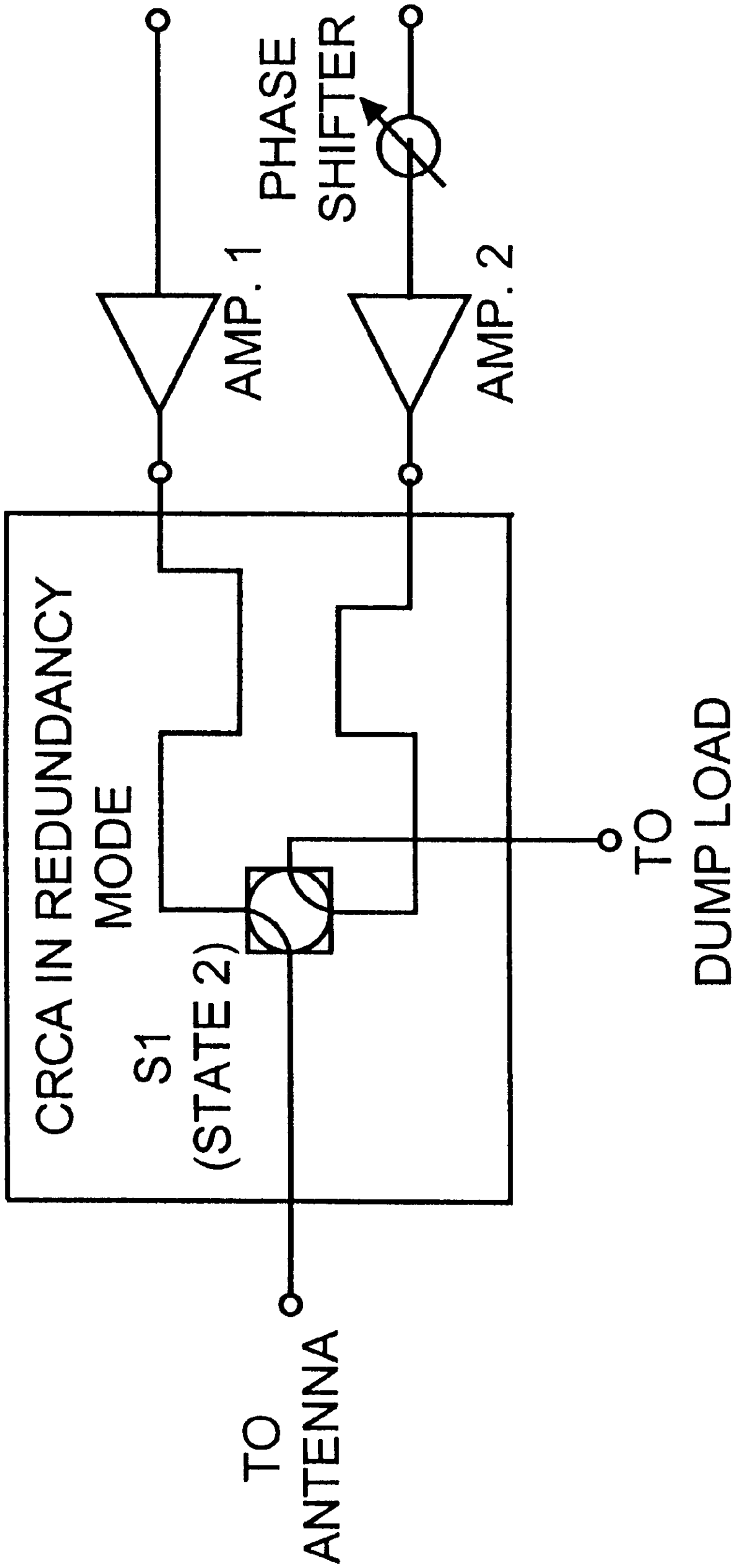
FIGURE 2 - Schematic of CRCA in redundancy mode

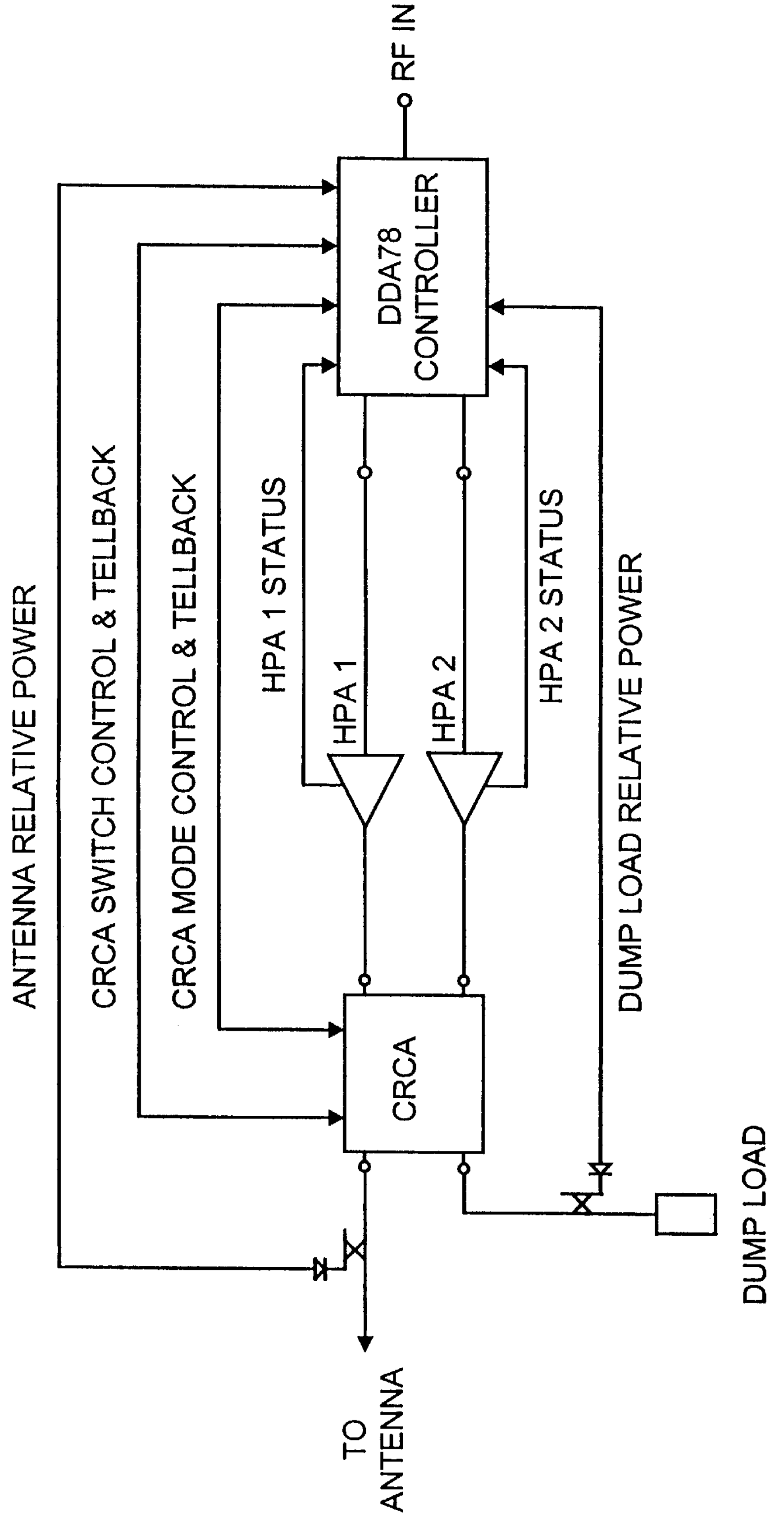
FIGURE 3 - Schematic of CRCA in a fully automatic redundancy system

VIEW WITH COVERS REMOVED

SECTION A-A

SECTION A-A

COMPACT REDUNDANCY COMBINER ASSEMBLY AND METHOD OF OPERATION THEREOF

This application claims the benefit of U.S. Provisional Application Ser. No. 60/058,862, filed Sep. 12, 1997 and U.S. Provisional Application Ser. No. 60/058,885, filed Sep. 15, 1997.

BACKGROUND OF THE INVENTION

1. Field of Invention

The use of redundant high power amplifiers, with more than adequate output power margins, is still commonplace in satellite communication earth terminals.

Redundancy is employed to ensure continuity of service in the event of an amplifier failure, while the power margin provides for an acceptable transmission level during adverse propagation conditions, or loss of transponder gain.

It is often desirable, both for economic and technical reasons, to provide an adequate output power margin by connecting two amplifiers in parallel, each rated at one half the required output power. This is particularly true for satellite earth terminals operating in the higher frequency bands where large amounts of power may not be available by means other than paralleling.

In the case of failure of one amplifier, the available output drops nominally by 3 dB. To the extent that amplifier failure and propagation conditions resulting in fades in excess of 3 dB occur rarely, the probability of a service interruption or severely degraded transmission is very small.

In applications such as transportable stations, it may be important to use the smallest possible antenna. By operating the amplifiers in parallel, the antenna gain requirement can by reduced by 3 dB compared to a conventional design.

In order to implement the conversion from two parallel amplifiers to a single amplifier, the following three conditions must be fulfilled:

(i) power combining of the two amplifiers (ii) provision for a straight through connection between antenna and either amplifier (iii) provision to terminate either, or both amplifiers in a dump load Previously, phase combining with redundancy has been achieved using a combination of couplers, phase shifters, switches and dump loads. However, the cost and size of these combines has been prohibitive due to the number of components required.

A more acceptable solution is the Variable Power Combiner (VPC) which essentially consists of two orthomode tranducers (OMT) joined by a rotating half-wave plate. These combiners also tend to be cumbersome and expensive, and limited to a bandwidth of only about 5% typically.

SUMMARY OF THE INVENTION

The Compact Redundancy Combiner Assembly of the present invention is lightweight, uncomplicated, offers a typical operating bandwidth of 20% and fits into a small space envelope, making it ideal for transportable station applications.

A redundancy assembly has two amplifiers connected in parallel along a waveguide path to a hybrid, said hybrid being connected through a transfer switch to an antenna, said hybrid containing a coupling plate comprising an array of coupling slots to allow combining of signals from the two amplifiers in a first position of said coupling plate when both amplifiers are operating properly, said coupling plate being movable to a second position wherein said array is replaced by a metal wall when one of the said amplifiers fails leaving an operating amplifier of said two amplifiers, said switch also having two positions so that when one amplifier fails, an output from the operating amplifier of said at least two amplifiers is directed through said switch to said antenna while an output of the amplifier that fails is directed through said switch to a dump load.

A method of operating a combiner assembly to combine output from two amplifiers when both of said amplifiers are operating properly and to pass said output to an antenna through a transfer switch, said method comprising replacing a coupling array with a metal wall when one amplifier fails and controlling said switch to pass an output from an amplifier that is operating properly to said antenna and to pass an output from said amplifier that has failed to a dump load.

BRIEF DESCRIPTION OF THE DRAWINGS

FIG. 1A is a schematic of a simple phase prior art combiner;

FIG. 1 is a schematic view of a compact redundancy combiner assembly in a combining mode;

FIG. 2 is a schematic view of a compact redundancy combiner assembly in a redundancy mode;

FIG. 3 is a schematic of a circuit for a fully automatic compact redundancy combiner assembly;

DESCRIPTION OF A PREFERRED EMBODIMENT

Figures 4, 4B:
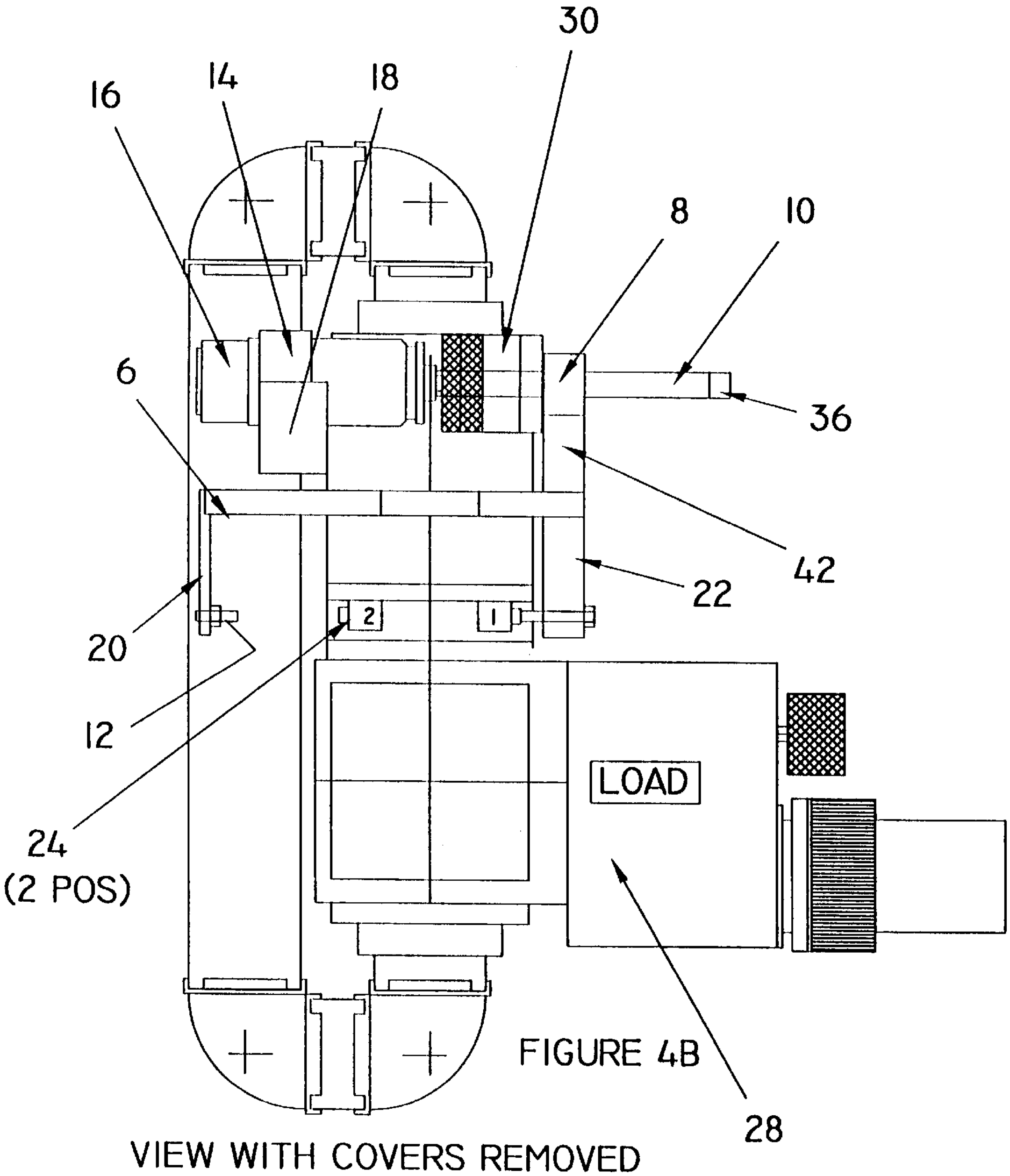
FIG. 4B is a side view with covers removed.

A Compact Redundancy Combiner Assembly (CRCA) is utilized to facilitate redundancy in a two amplifier phase combining system. Should one of the amplifiers fail, then the CRCA can be configured to allow the functional amplifier to deliver its full output power to the antenna with minimal loss, while routing the failed, or redundant amplifier, to a dump load.

The CRCA in the combining mode, operates exactly the same as the prior art phase combiner described in FIG. 1A. The prior art combiner consists of a 90 degree quadrature coupler and a phase shifter. The redundancy mode is achieved by replacing the coupling elements in the 3 dB hybrid with a short circuit plate and the use of a transfer switch. The CRCA mode of operation can either be changed manually, or as is preferred, controlled electronically.

FIG. 1 shows a schematic of the CRCA in the combining mode. The Phase shifter is adjusted for a maximum combined power of the two amplifiers at the output port (or minimum power at the dump load port).

FIG. 2 shows a schematic of the CRCA in the redundancy mode, after failure of amplifier 2. The functional amplifier 1 is routed to the output via the low loss path and transfer switch. Without this feature the output power would be reduced by 6 dB, instead of 3 dB (3 dB due to loss of the failed amplifier and 3 dB due to the coupler).

Conversely, if amplifier 1 had failed, the transfer switch S1 would be set to the opposite state (state 1).

Table 1 summarizes the CRCA functions. Although other combinations are possible, they have no practical value in redundancy application, and have therefore not been included.

TABLE 1

Summary of CRCA Functions

| AMP.1 POWER | AMP.2 POWER | PHASE COMBINING | SWITCH STATE | CRCA MODE | ANTENNA POWER | LOAD POWER |
|---|---|---|---|---|---|---|
| P1 | P2 | YES | 1 | COMBINING | P1 + P2 | 0 |
| P1 | P2 | YES | 2 | — | 0 | P1 + P2 |
| P1 | P2 | NO | 1 | REDUNDANCY | P2 | P1 |
| P1 | P2 | NO | 2 | — | P1 | P2 |
| P1 | 0 | NO | 1 | — | 0 | P1 |
| P1 | 0 | NO | 2 | — | P1 | 0 |
| 0 | P2 | NO | 1 | — | P2 | 0 |
| 0 | P2 | NO | 2 | — | 0 | P2 |

In practice, the CRCA is configured as a fully automatic redundancy phase combining system. Limit switches are used to convey tellback information to the DDA78 controller about the current position of the switch and mode of the CRCA (i.e. combining or redundancy mode). The controller monitors the "health" status of the amplifiers and controls both the transfer switch position and the CRCA mode according to this status. The CRCA takes a maximum of 6 seconds and preferably approximately 3.5 seconds to change from the combining to the redundancy mode of operation.

FIG. 3 shows a schematic of the CRCA in a fully automatic redundancy system. The status of the high power amplifier 1 and high power amplifier 2 is monitored by the DDA78 controller. When either amplifier 1 or amplifier 2 fails, the controller causes a coupling plate (not shown in FIG. 1) within the three 3 dB hybrid to move and a coupling array (not shown in FIG. 1) is replaced with a metal wall (not shown in FIG. 1). The short circuit and transfer switch together provide a low loss path between the functional amplifier and the antenna. Output from amplifier 1 is directed by the controller through the transfer switch to dump load when amplifier 1 fails. The output from amplifier 2 is directed by the controller through the switch to the dump load when amplifier 2 fails. Simultaneously with the movement of the coupling plate, the two position transfer switch directs output from the amplifiers to either the dump load or to the antenna depending on which of the amplifiers has failed. When both amplifiers are operating properly, the coupling plate is positioned such that the coupling array (not shown in FIG. 1) is positioned appropriately within the hybrid body (not shown in FIG. 1) allowing the combined output of the two amplifiers to be fed to the antenna.

Figure 4A:
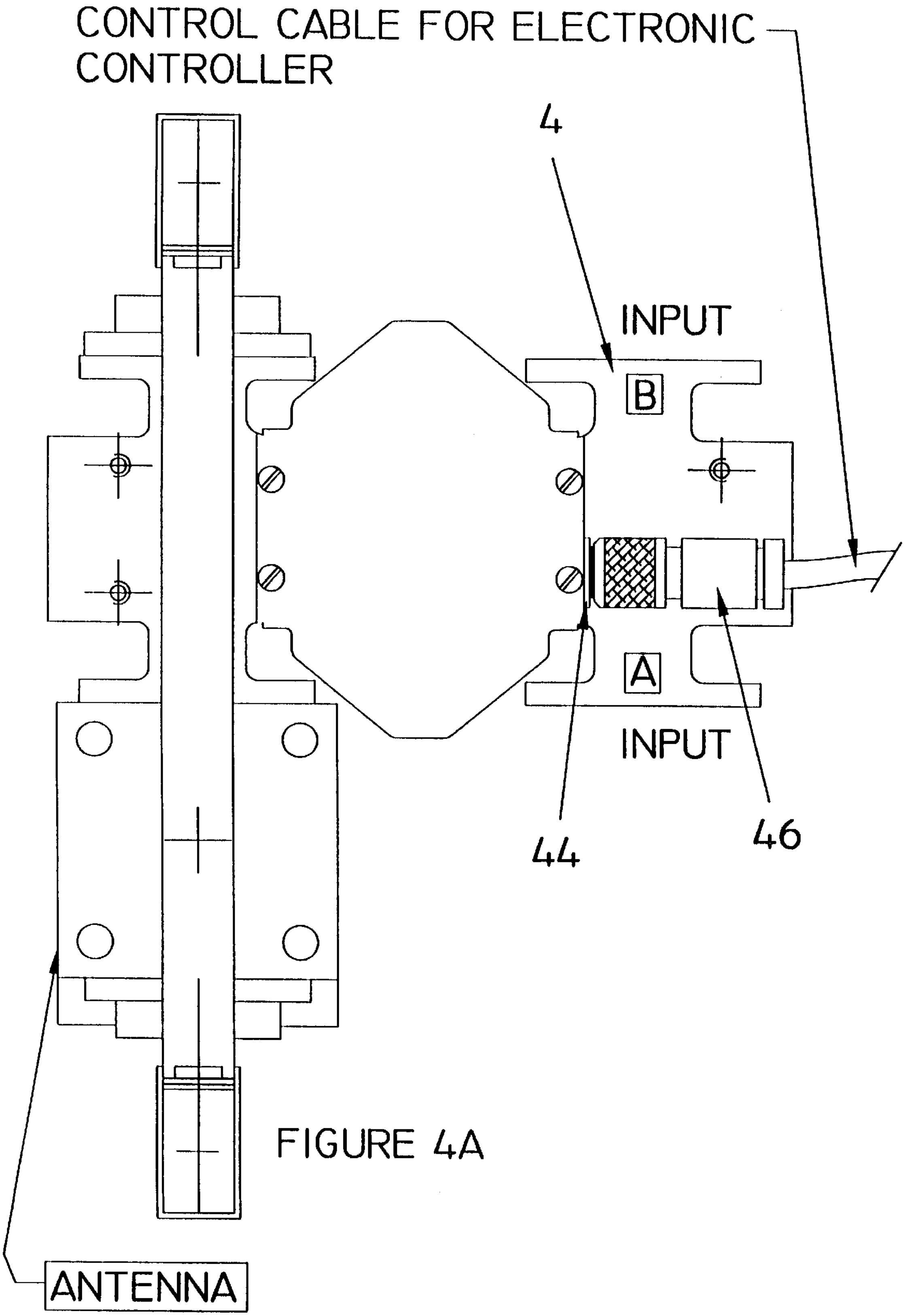
FIG. 4A is a front view of a combiner assembly.
Figure 4C:
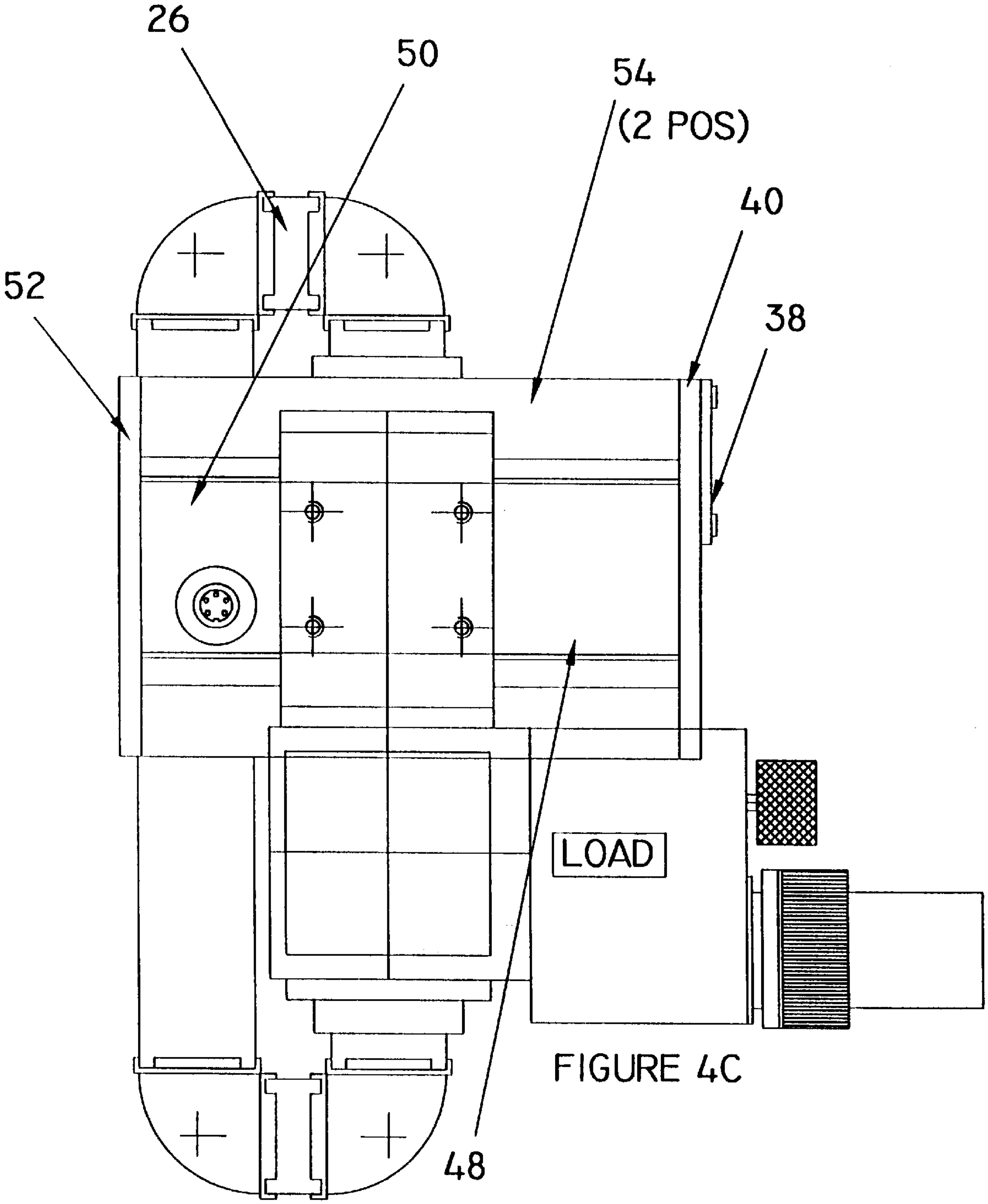
FIG. 4C is a side view with the covers in place.

In FIGS. 4A, 4B and 4C a coupler assembly 4 has two split block machined pieces bolted together and dip brazed. This assembly 4 forms two identical waveguide paths, between which, a high tolerance slot is spark eroded to allow the coupling plate 6 to slide. The coupling plate 6 is a high tolerance machined brass plate with spark eroded coupling slots. The coupling plate 6 and the coupler assembly 4 together operate as a 3 dB branch-guide coupler when the coupling slots are positioned between the two waveguide paths. When the coupling plate 6 is moved such that the coupling slots are replaced by the plain metal wall (i.e. short circuit plate), the coupler assembly 4 then acts as two isolated waveguide paths. A lead screw mounting block 8 is used to fix the coupling plate 6 to a lead screw 10. It has a threaded opening in which a screw 12 is inserted and adjusted to facilitate a "hard stop" for manual operation. The coupling plate has two positions, a first position when a coupling array of the coupling plate 4 is aligned with the slot in the coupler assembly 4 and a second position when the coupling plate 6 is positioned such that the coupling array is replaced with a short circuit.

A motor mounting clamp 14 secures a motor 16 in position by clasping it against the motor mounting bracket 18, which in turn, secures the motor 16 to the coupler assembly 4. A limit switch bar 20,22 is attached to the end of the coupling plate 6 and has a screw 12 which makes contact with a limit switch 24 when the coupling plate 6 is in one of its two respective operating positions. A waveguide assembly 26 forms an RF path between the coupler assembly 4 and a waveguide switch 28. A unilateral coupling 30 compensates for any misalignment between the motor 16 and the lead screw 10. The motor 16 drives the coupling plate 6 to one of its two respective operating positions, as defined by the user input. Access to the manual override block 36 connected to the end of the lead screw 10 is via an access cover 38 fixed to an end cover 40.

The lead screw 10 and nut 42 is fixed to the unilateral coupling 30 and the lead screw mounting block 8. The function of the unilateral coupling 30 and lead screw mounting block 8 with the lead screw 10 and the nut 42 is to convert the rotary movement of the motor 16 into a linear movement of the coupling plate 6. A socket 44, with its mating plug 46, forms a weather sealed connection between the CRCA and the electronic controller. The waveguide switch 28 is bolted directly to the coupler assembly 4 and facilitates switching between the antenna and the dump load ports. Support plates 20, 48, 50, end covers 40, 52 and side covers 54 together form a protective enclosure for the electromechanical parts.

Figure 5:
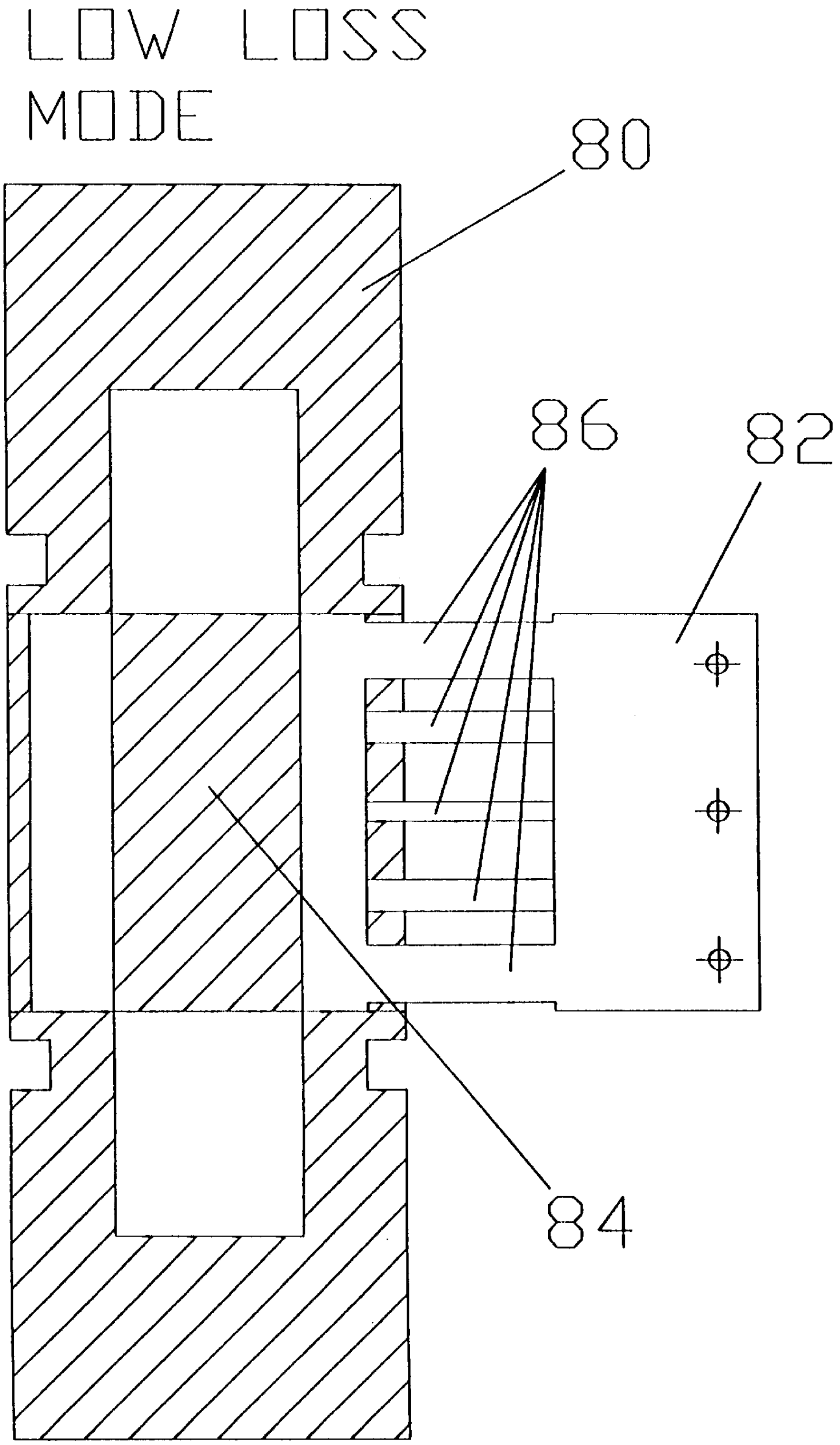
FIG. 5 is an expanded side view of part of a hybrid in a redundancy mode.
Figure 6:
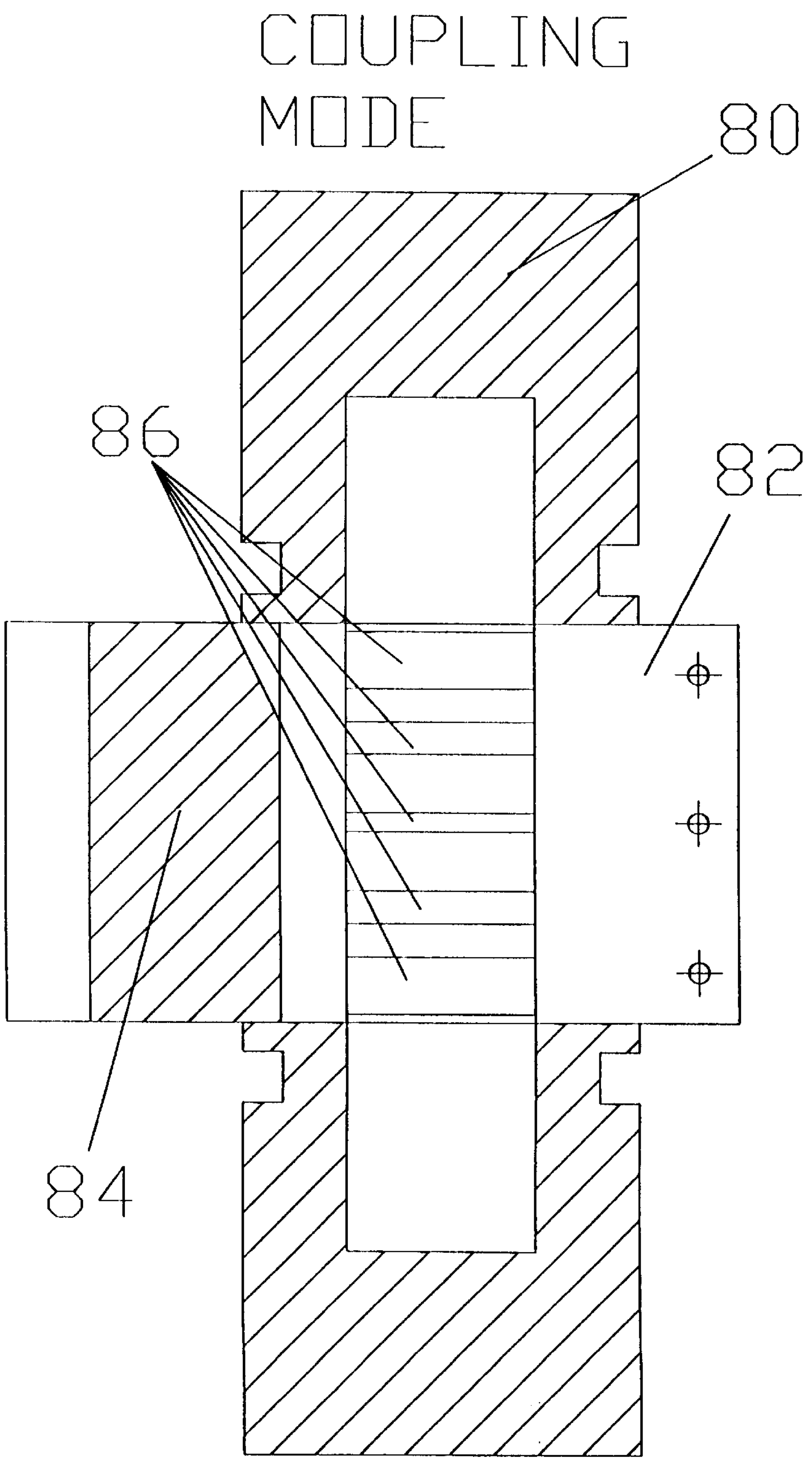
FIG. 6 is a side view of part of a hybrid in a coupling mode.

In FIGS. 5 and 6, a hybrid body 80 has a coupling plate 82 containing an array of slots 86. The coupling plate 82 is movable between a first position shown in FIG. 6 and a second position shown in FIG. 5. In FIG. 6, the array of slots 86 of the coupling plate 82 is aligned with the slot 90 (See FIG. 7) of the hybrid body 80. In this position, the hybrid body 80 combines the signals from the two amplifiers (not shown) and passes the output to the antenna (not shown) through a switch (not shown). In FIG. 5, the coupling plate 82 is shown in the opposite position with the array of slots 86 now replaced with a plain metal wall 84. In this position, when one amplifier (not shown) fails, the other amplifier, being the operating amplifier (not shown), is directed to the switch (not shown). The switch is a four port transfer switch and is positioned to direct the output from the amplifier that is operating properly to the antenna and to direct the output from the amplifier that has failed to a dump load.

Figure 7:
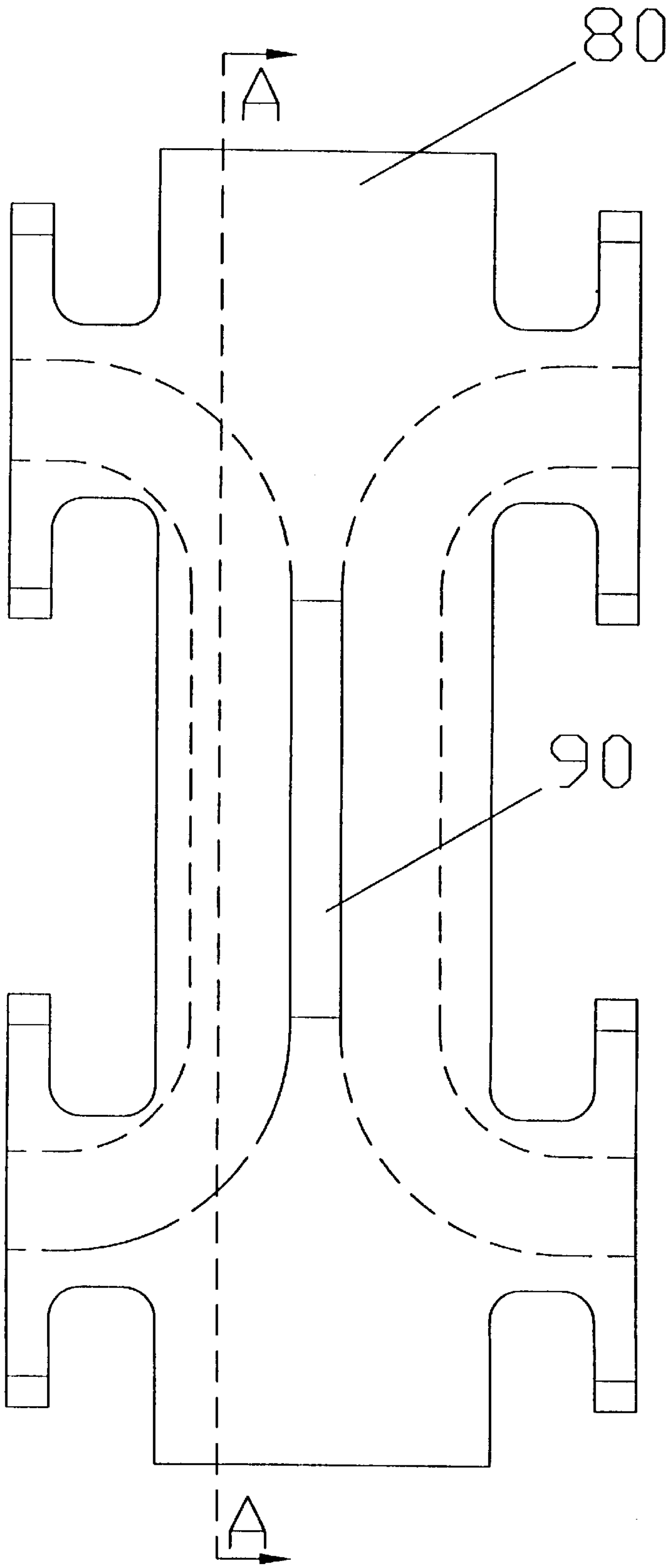
FIG. 7 is a front view of part of a hybrid.

In FIG. 7, the front view of the hybrid 80 and coupling plate 82 is shown.

APPENDIX I
Phase Combining Using A Quadrature Hybrid

A schematic view of a prior art simple phase combiner, consisting of a 90 degree quadrature coupler and a phase shifter is shown in FIG. 1A.

If two waves of constant amplitudes $E1 = Ee^{-j\phi 1}$ and $E2 = Ee^{-j\phi 2}$ are incident at the input ports, then the wave amplitudes, Ea and Eb at the output ports are:

$$Ea = \frac{E}{\sqrt{2}}\left[e^{-j\phi_1} + e^{-j\left(\phi_2+\phi+\frac{\pi}{2}\right)}\right]$$

$$Eb = \frac{E}{\sqrt{2}}\left[e^{-j\left(\phi_1+\frac{\pi}{2}\right)} + e^{-j(\phi_2+\phi)}\right]$$

If $\phi = \pi\phi_1 - \phi_2 - \frac{\pi}{2}$ then $Ea = 0$ and $Eb = \sqrt{2}\,Ee^{-j\left(\phi_1-\frac{\pi}{2}\right)}$ Since $|P|\alpha|E^2|$ then $|Pa| = 0$ and $|Pb| = |2P|$

I claim:

1. A redundancy combiner assembly comprises two amplifiers connected in parallel along a waveguide path to a hybrid, said hybrid being connected through a transfer switch to an antenna, said hybrid containing a coupling plate comprising a coupling array of slots to allow combining of signals from the two amplifiers in a first position of said coupling plate when both amplifiers are operating properly, said coupling plate being movable to a second position wherein said array is replaced by a metal wall when one of said amplifiers fails leaving an operating amplifier of said two amplifiers, said switch also having two positions so that when one amplifier fails, an output from said operating amplifier is directed through said switch to said antenna while an output of said amplifier that fails is directed through said switch to a dump load.

2. A combiner assembly as claimed in claim 1 wherein said assembly has a combining mode and a redundancy mode and there is a controller connected control said coupling plate, said controller moving said assembly between said combining mode and said redundancy mode.

3. A combiner assembly as claimed in claim 2 wherein said controller is connected to control said transfer switch.

4. A combiner assembly as claimed in claim 3 wherein said controller is connected to monitor said amplifiers to determine whether or not said amplifiers are in operating condition.

5. A combiner assembly as claimed in claim 4 wherein there are limit switches connected to convey tellback information to said controller, concerning a current position of said transfer switch, a mode of said combiner assembly and a status of the said amplifiers.

6. A combiner assembly as claimed in claim 5 wherein the controller is a DDA78 controller.

7. A combiner assembly as claimed in any one of claims 1, 2 or 3 wherein said assembly can be moved between modes a maximum of six seconds.

8. A combiner assembly as claimed in any one of claims 1, 2 or 3 wherein the time to switch the assembly between modes is approximately three and a half seconds.

9. A combiner assembly as claimed in claim 4 wherein the assembly has two identical waveguide paths between which a spark eroded slot is located, said coupling plate being slidable within said slot.

10. A combiner assembly as claimed in claim 9 wherein said coupling plate is a brass plate with spark eroded coupling slots.

11. A combiner assembly as claimed in claim 4 wherein movement of the coupling plate is powered by a motor.

12. A combiner assembly as claimed in claim 2 wherein said transfer switch is a four port transfer switch.

13. A method of operating a combiner assembly to combine output from two amplifiers when both of said amplifiers are operating properly and to pass said output to an antenna through a transfer switch, said method comprising replacing a coupling array with a metal wall when one amplifier fails and controlling said switch to pass an output from the amplifier that is operating properly to the antenna and to pass a signal from the amplifier that has failed to a dump load.

14. A method as claimed in claim 13 wherein said coupling array is located on a coupling plate, said coupling plate being slidable within a slot in said combiner assembly, said switch and said coupling plate being controlled by a controller, said method including the steps of operating said controller to monitor a status of said amplifiers and, when one amplifier fails, operating said controller to move said coupling plate so that coupling array is replaced by said metal wall and said switch is moved to a second position.

* * * * *